(12) United States Patent
Sonsky et al.

(10) Patent No.: US 8,247,280 B2
(45) Date of Patent: Aug. 21, 2012

(54) INTEGRATION OF LOW AND HIGH VOLTAGE CMOS DEVICES

(75) Inventors: Jan Sonsky, Leuven (BE); Anco Heringa, Waalre (NL)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 156 days.

(21) Appl. No.: 12/582,334

(22) Filed: Oct. 20, 2009

(65) Prior Publication Data
US 2011/0089498 A1    Apr. 21, 2011

(51) Int. Cl.
*H01L 21/8238* (2006.01)

(52) U.S. Cl. .......... 438/199; 438/275; 257/E21.632; 257/E21.616

(58) Field of Classification Search .......... 438/199, 438/275; 257/392
See application file for complete search history.

(56) References Cited

U.S. PATENT DOCUMENTS

| | | | | |
|---|---|---|---|---|
| 4,806,500 A * | 2/1989 | Scheibe | ............... | 438/200 |
| 5,498,554 A * | 3/1996 | Mei | ............... | 438/200 |
| 5,523,248 A * | 6/1996 | Yamazaki | ............... | 438/275 |
| 5,747,850 A * | 5/1998 | Mei | ............... | 257/328 |
| 6,090,652 A * | 7/2000 | Kim | ............... | 438/228 |
| 6,207,510 B1 * | 3/2001 | Abeln et al. | ............... | 438/276 |
| 6,451,640 B1 * | 9/2002 | Ichikawa | ............... | 438/199 |
| 6,624,487 B1 * | 9/2003 | Kunz et al. | ............... | 257/409 |
| 6,660,603 B2 * | 12/2003 | Mitros | ............... | 438/303 |
| 6,740,939 B2 * | 5/2004 | Sayama et al. | ............... | 257/371 |
| 6,902,258 B2 * | 6/2005 | Chen et al. | ............... | 347/59 |
| 7,816,201 B2 * | 10/2010 | Kato et al. | ............... | 438/217 |
| 7,838,940 B2 * | 11/2010 | Schneider et al. | ............... | 257/355 |
| 2002/0055233 A1 * | 5/2002 | Mitros | ............... | 438/299 |
| 2003/0032231 A1 * | 2/2003 | Efland et al. | ............... | 438/200 |
| 2005/0164439 A1 * | 7/2005 | Takamura | ............... | 438/197 |
| 2005/0242398 A1 * | 11/2005 | Chen et al. | ............... | 257/348 |
| 2006/0099753 A1 * | 5/2006 | Chen et al. | ............... | 438/199 |
| 2006/0141714 A1 * | 6/2006 | Lee | ............... | 438/275 |
| 2007/0048933 A1 * | 3/2007 | Fujita | ............... | 438/253 |
| 2007/0138592 A1 * | 6/2007 | Chang et al. | ............... | 257/500 |
| 2007/0281414 A1 * | 12/2007 | Ohkawa et al. | ............... | 438/218 |

(Continued)

FOREIGN PATENT DOCUMENTS

JP    2004-200650    *   7/2004

OTHER PUBLICATIONS

Damiano Riccardi et al., "BCD8 from 7V to 70V: A New 0.18um Technology Platform to Address the Evolution of Applications towards Smart Power ICs with High Logic Contents", Proceedings of the 19th International Symposium on Power Semiconductor Devices & ICs, May 27-30, 2007, Jeju, Korea, pp. 73-76.

*Primary Examiner* — A. Sefer
(74) *Attorney, Agent, or Firm* — Haynes and Boone, LLP

(57) ABSTRACT

A method of fabricating a semiconductor device is provided that includes providing a semiconductor substrate having a first portion and a second portion, forming a first transistor in the first portion of the substrate, the first transistor being operable at a first voltage, and forming a second transistor in the second portion of the substrate, the second transistor being operable at a second voltage greater than the first voltage. The formation of the second transistor includes forming an extended feature of the second transistor with a photomask that is used to adjust a threshold voltage of the first transistor.

14 Claims, 12 Drawing Sheets

U.S. PATENT DOCUMENTS

| | | | |
|---|---|---|---|
| 2008/0067599 A1* | 3/2008 | Tsutsumi et al. | 257/358 |
| 2008/0073745 A1* | 3/2008 | Tang et al. | 257/500 |
| 2008/0237690 A1* | 10/2008 | Anezaki et al. | 257/316 |
| 2009/0267147 A1* | 10/2009 | De Boet et al. | 257/337 |
| 2009/0280613 A1* | 11/2009 | Onoda et al. | 438/303 |
| 2010/0112764 A1* | 5/2010 | Mehrotra et al. | 438/210 |
| 2010/0117150 A1* | 5/2010 | Pendharkar et al. | 257/337 |
| 2010/0315159 A1* | 12/2010 | Kocon et al. | 327/564 |
| 2011/0156144 A1* | 6/2011 | Benaissa et al. | 257/338 |

* cited by examiner

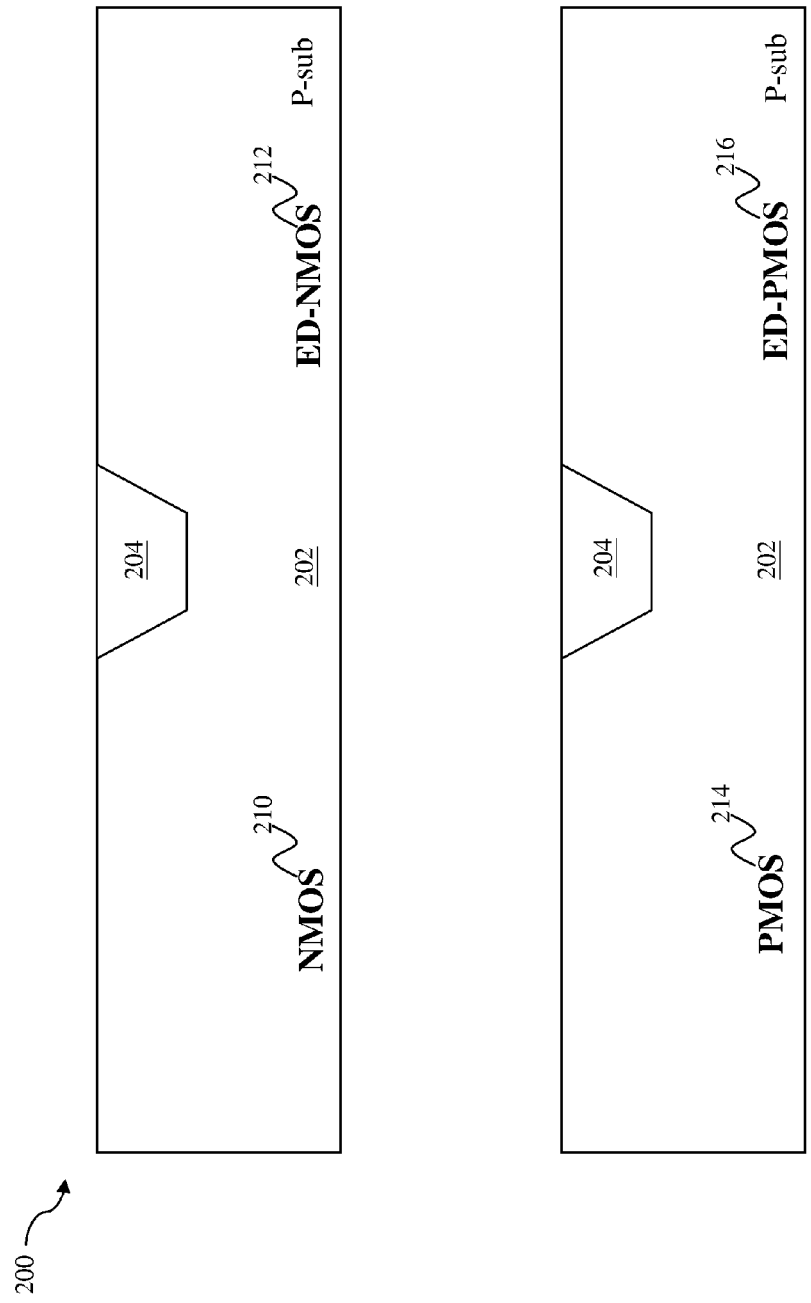

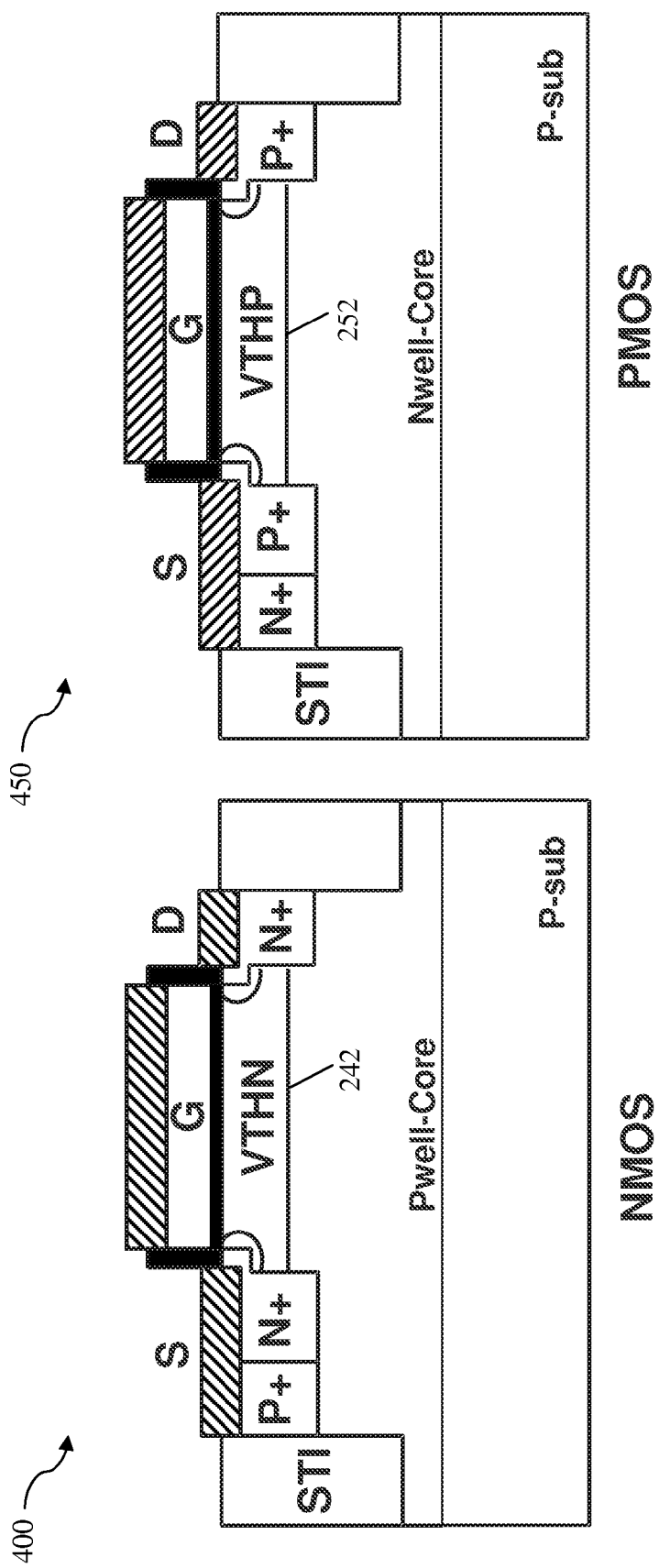

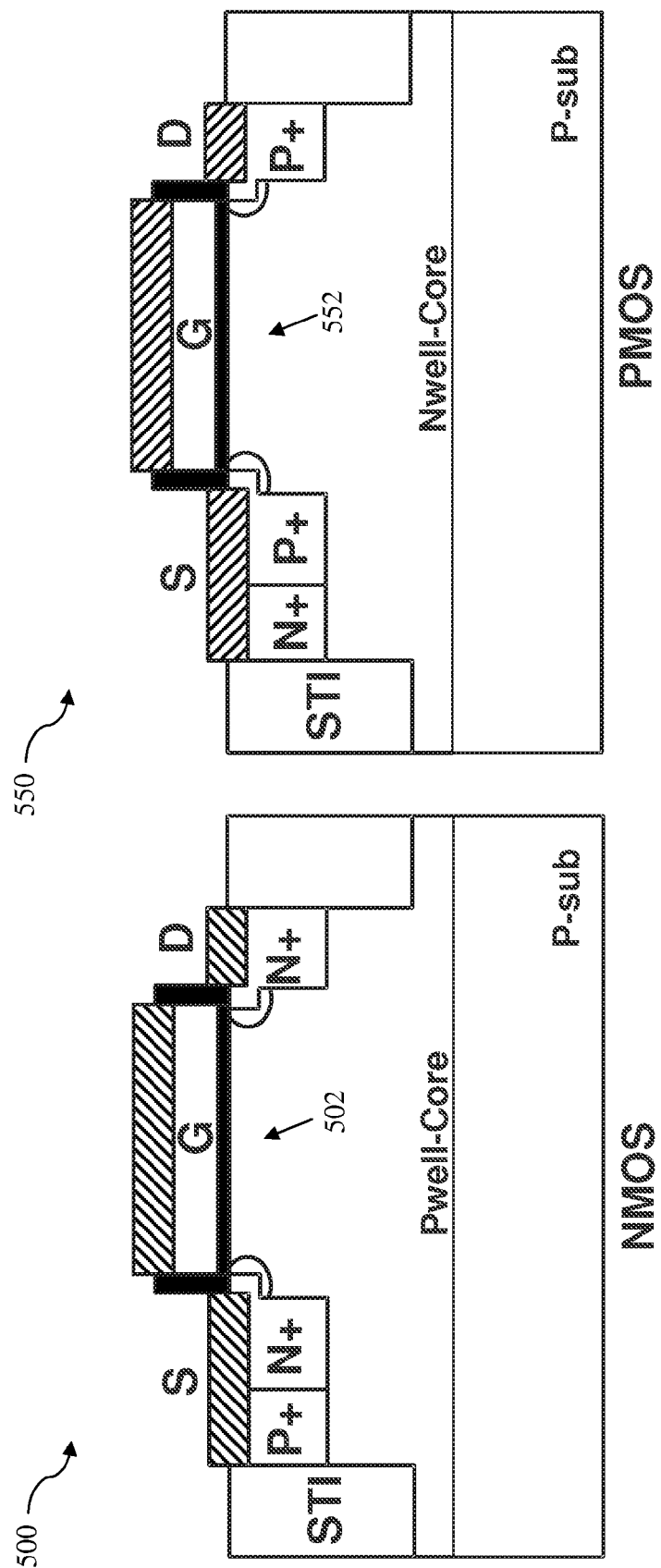

US 8,247,280 B2

INTEGRATION OF LOW AND HIGH VOLTAGE CMOS DEVICES

BACKGROUND

The present disclosure relates generally to semiconductor technology, and more particularly, to low and high voltage devices and method of making the same.

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

As semiconductor circuits such as complementary metal-oxide-semiconductor field effect transistors (CMOSFETs) are adapted for high voltage applications, several approaches have been utilized for incorporating a high voltage device with a low voltage device (e.g., logic device or memory device) for system-on-chip (SoC) technology. One approach cascodes two or more transistors to achieve the required high voltage capability. Another approach utilizes additional process steps/masks to fabricate high voltage transistors (e.g., laterally diffused MOS transistor) that are integrated in current CMOS process technology. Although these approaches have been satisfactory for their intended purposes, they have not been satisfactory in all respects. For example, cascoding two or more transistor requires a larger footprint (chip area) and complex circuitry to generate multiple bias voltages to support nodes between the cascoded transistors, consumes higher power, and exhibits poor high frequency behavior.

SUMMARY

One of the broader forms of an embodiment of the present invention involves a method of fabricating a semiconductor device. The method includes providing a semiconductor substrate having a first portion and a second portion; forming a first transistor in the first portion of the substrate, the first transistor being operable at a first voltage; and forming a second transistor in the second portion of the substrate, the second transistor being operable at a second voltage greater than the first voltage. The forming of the second transistor includes forming an extended feature of the second transistor with a photomask that is used to adjust a threshold voltage of the first transistor.

Another one of the broader forms of an embodiment of the present invention involves a method of fabricating a semiconductor device. The method includes providing a semiconductor substrate having a first portion and a second portion; forming a first transistor in the first portion of the substrate; and forming a second transistor in the second portion of the substrate. The forming of the second transistor includes forming an extended drain of the second transistor with an implant process that is performed to adjust a threshold voltage of the first transistor.

Yet another one of the broader forms of an embodiment of the present invention involves a semiconductor device. The semiconductor device includes a semiconductor substrate having a first portion and a second portion; a first transistor formed in the first portion of the substrate, the first transistor being operable at a first voltage; and a second transistor formed in the second portion of the substrate, the second transistor being operable at a second voltage greater than the first voltage. The second transistor includes an extended feature that is formed with an implant process that forms a doped channel region of the first transistor such that the extended feature of the second transistor has an equivalent doping concentration as the doped channel region of the first transistor. The doping concentration of the doped channel region adjusts the threshold voltage of the first transistor.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A to 2F are cross-sectional views of a semiconductor device at various stages of fabrication according to various aspects of the present disclosure;

FIGS. 4A and 4B are cross-sectional views of a core NMOS transistor and core PMOS transistor, respectively, including a high threshold voltage implant;

FIGS. 5A and 5B are cross-sectional views of a core NMOS transistor and core PMOS transistor, respectively, without a high threshold voltage implant.

DETAILED DESCRIPTION

Figure 1:
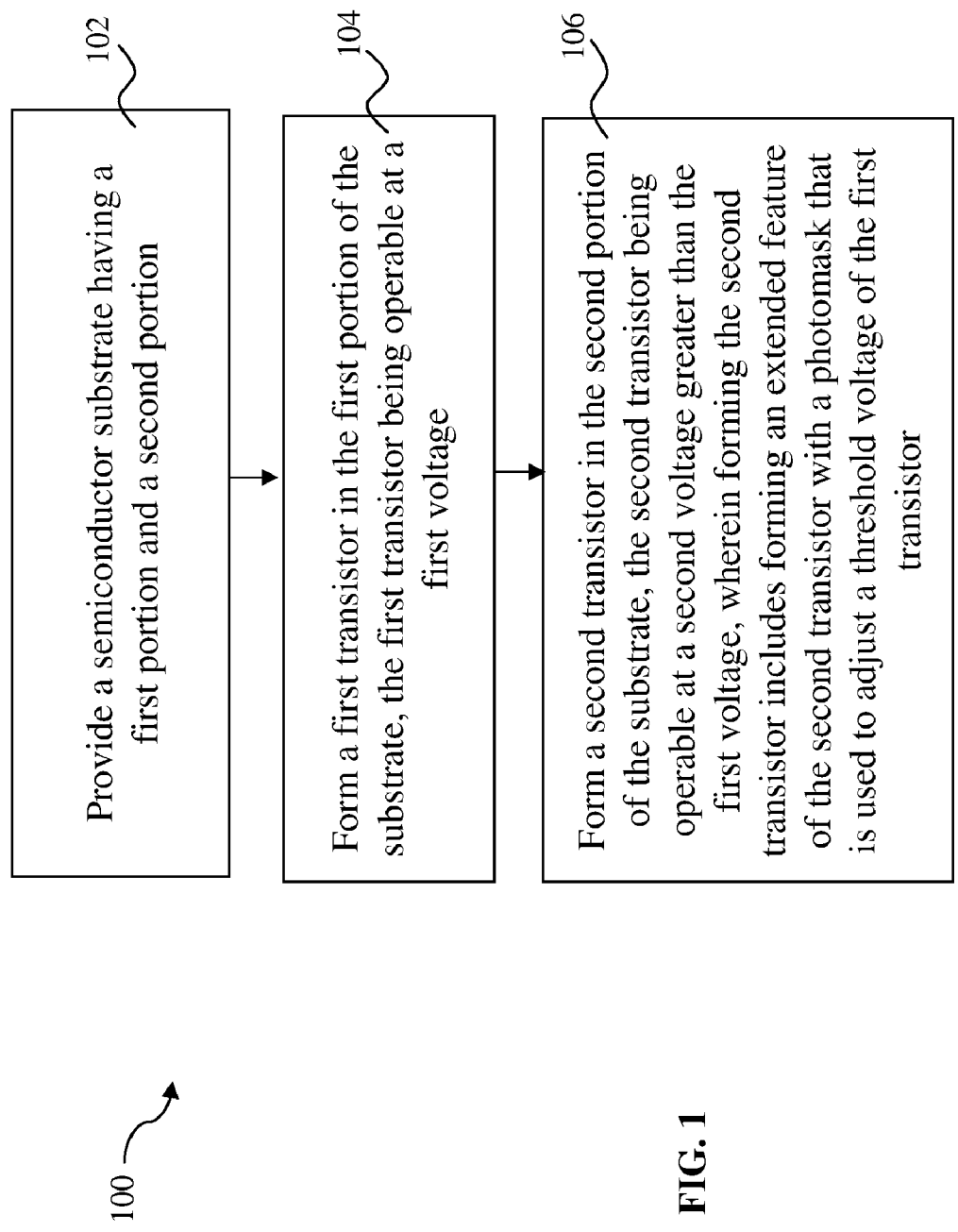
FIG. 1 is a process diagram of a method for fabricating a semiconductor device according to various aspects of the present disclosure.

The present disclosure relates generally to the field of semiconductor integrated circuits. It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a process diagram of a method 100 for fabricating a semiconductor device according to various aspects of the present disclosure. The method 100 begins with block 102 in which a semiconductor substrate is provided. The semiconductor substrate includes a first portion and a second portion. The method 100 continues with block 104 in which a first transistor is formed in the first portion of the substrate. The first transistor is operated at a first voltage. In block 106 a second transistor is formed in the second portion of the substrate. The second transistor is operated at a second voltage greater than the first voltage. The second transistor includes an extended feature that is formed with a photomask that is used to adjust a threshold voltage of the first transistor. It is understood that blocks 104 and 106, respectively, are typically performed in parallel, although one may be performed after another. An exemplary embodiment of an implementation of the method 100 is discussed below with reference to FIGS. 2A to 2F.

Referring to FIGS. 2A to 2F, illustrated are cross-sectional views of a semiconductor device 200 at various stage of fabrication according to the method 100 of FIG. 1. It should be noted that the method 100 may be implemented in a CMOS technology process flow. Accordingly, it is understood that additional processes be provided before, during, and after the method 100, and some processes may only be briefly described herein. Further, FIGS. 2A to 2F are simplified for a better understanding of the disclosed embodiment, and the semiconductor device 200 may be configured as a system-on-chip (SoC) device having various PMOS and NMOS transistors that are fabricated to operate at different voltage levels. The PMOS and NMOS transistors may provide low voltage functionality including logic/memory devices and input/output devices, and high voltage functionality including power management devices. For example, the transistors that provide low voltage functionality may have operating (or drain) voltages of 1.1 V with standard CMOS technology, or voltages of 1.8/2.5/3.3 V with special (input/output) transistors in standard CMOS. The transistors that provide medium/high voltage functionality may have operating (or drain) voltages of 5 V or greater (e.g., 20-35 V). It is understood that the semiconductor device 200 may also include resistors, capacitors, inductors, diodes, and other suitable microelectronic devices that are typically implemented in integrated circuits.

In FIG. 2A, a substrate 202 includes a semiconductor wafer such as a silicon wafer. Alternatively, the substrate may include other elementary semiconductors such as germanium. The substrate may also include a compound semiconductor such as silicon carbide, gallium arsenic, indium arsenide, and indium phosphide. The substrate may include an alloy semiconductor such as silicon germanium, silicon germanium carbide, gallium arsenic phosphide, and gallium indium phosphide. In one embodiment, the substrate includes an epitaxial layer (epi layer) overlying a bulk semiconductor. Furthermore, the substrate 202 may include a semiconductor-on-insulator (SOI) structure. In various embodiments, the substrate may include a buried layer such as an N-type buried layer (NBL), a P-type buried layer (PBL), and/or a buried dielectric layer including a buried oxide (BOX) layer. In the present embodiment, the substrate 202 includes a P-type silicon substrate (P-sub).

Isolation structures 204 such as shallow trench isolation (STI) or local oxidation of silicon (LOCOS) are formed in the substrate 202 to define and electrically isolate various active regions. As one example, the formation of an STI feature may include dry etching a trench in a substrate and filling the trench with insulator materials such as silicon oxide, silicon nitride, or silicon oxynitride. The filled trench may have a multi-layer structure such as a thermal oxide liner layer filled with silicon nitride or silicon oxide. In furtherance of the embodiment, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with oxide, using chemical mechanical polishing (CMP) processing to etch back and planarize, and using a nitride stripping process to remove the silicon nitride. In the present embodiment, the isolation structures 204 may define a region 210 for a core NMOS transistor, a region 212 for an extended drain NMOS (ED-NMOS) transistor, a region 214 for a core PMOS transistor, and a region 216 for an extended drain PMOS (ED-PMOS) transistor.

Figure 2B:
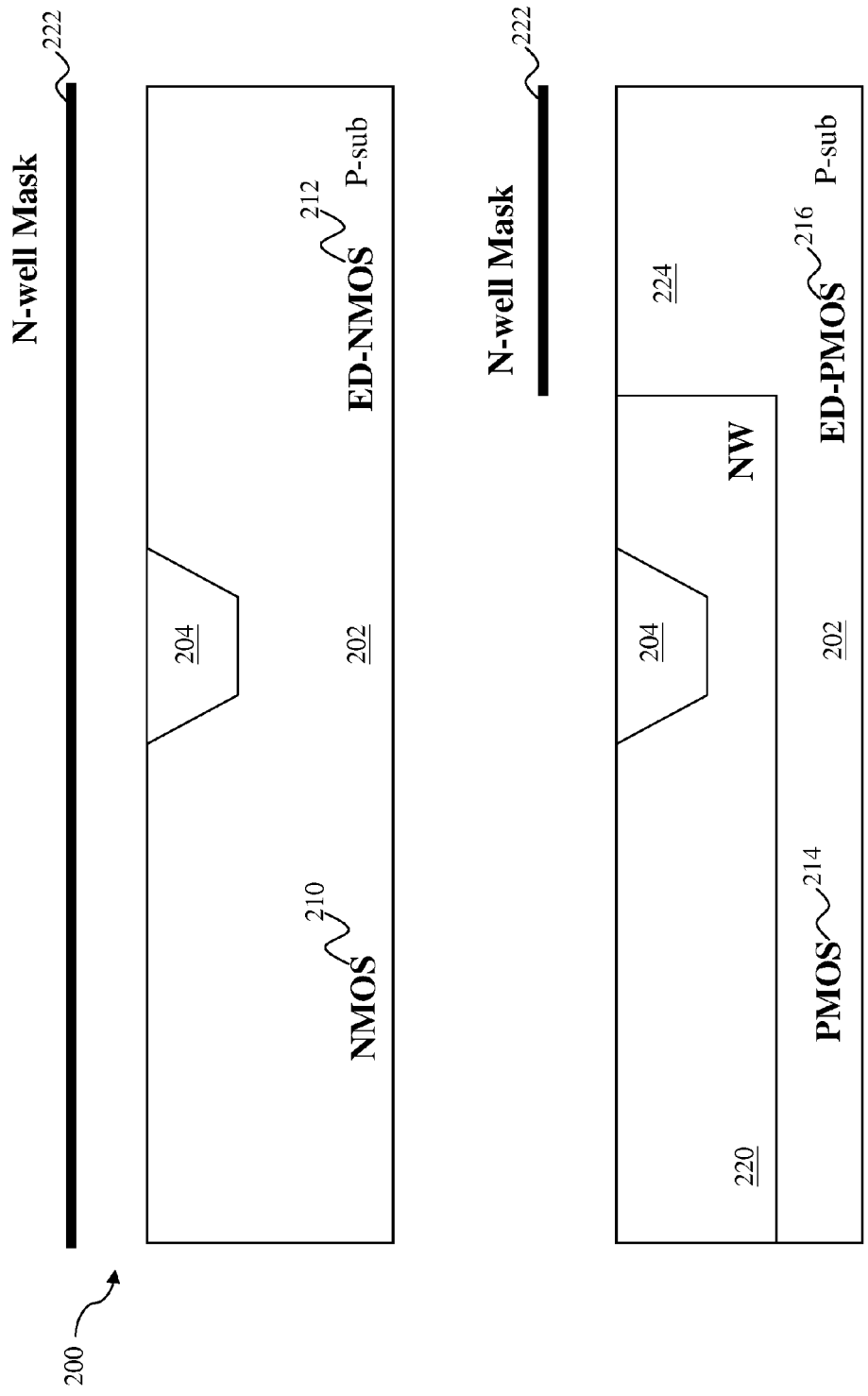

In FIG. 2B, an N-well 220 is formed in various regions of the P-substrate 202 by ion-implantation or diffusion techniques known in the art. For example, an N-well mask 222 is used to pattern a photoresist layer (not shown) in a photolithography process or other suitable process. An exemplary photolithography process may include processing steps of photoresist coating, soft baking, mask aligning, exposing, post-exposure baking, developing, and hard baking. The N-well mask 222 includes a pattern that protects the regions 210, 212 of the NMOS and ED-NMOS transistors, respectively, and protects a portion 224 of the region 216 where an extended drain feature of the ED-PMOS transistor will be subsequently formed. An ion implantation utilizing an N-type dopant, such as arsenic or phosphorus, may be performed to form the N-well 220 in the region 214 of the core PMOS transistor and in the region 216 of the ED-PMOS transistor where a source feature will be subsequently formed. It should be noted that the ED-PMOS transistor may be disposed in a deep N-well pocket (shown in FIG. 3B) for isolating the transistor.

Figure 2C:
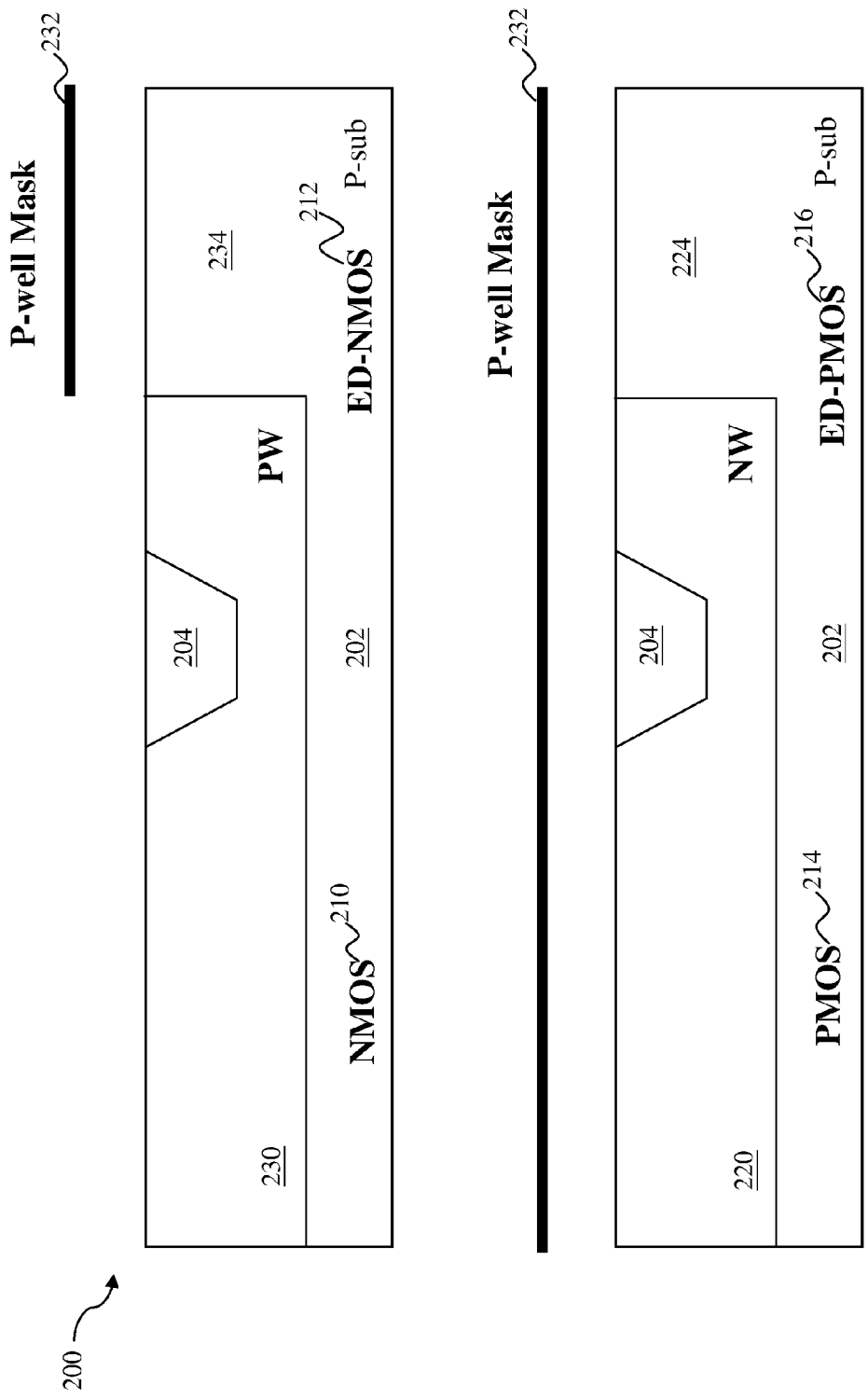

In FIG. 2C, a P-well 230 is formed in various regions of the P-substrate 202 by ion-implantation or diffusion techniques known in the art. The P-well 230 may be formed in a similar manner as was discussed above for the N-well 220. A P-well mask 232 is used to pattern a photoresist layer that protects the regions 214, 216 of the PMOS and ED-PMOS transistors, respectively, and protects a portion 234 of the region 212 where an extended drain feature of the ED-NMOS transistor will be subsequently formed. An ion implantation utilizing P-type dopant, such as boron, may be performed to form the P-well 230 in the region 210 of the core NMOS transistor and in the region 212 of the ED-NMOS where a source feature will be subsequently formed.

Figure 2D:
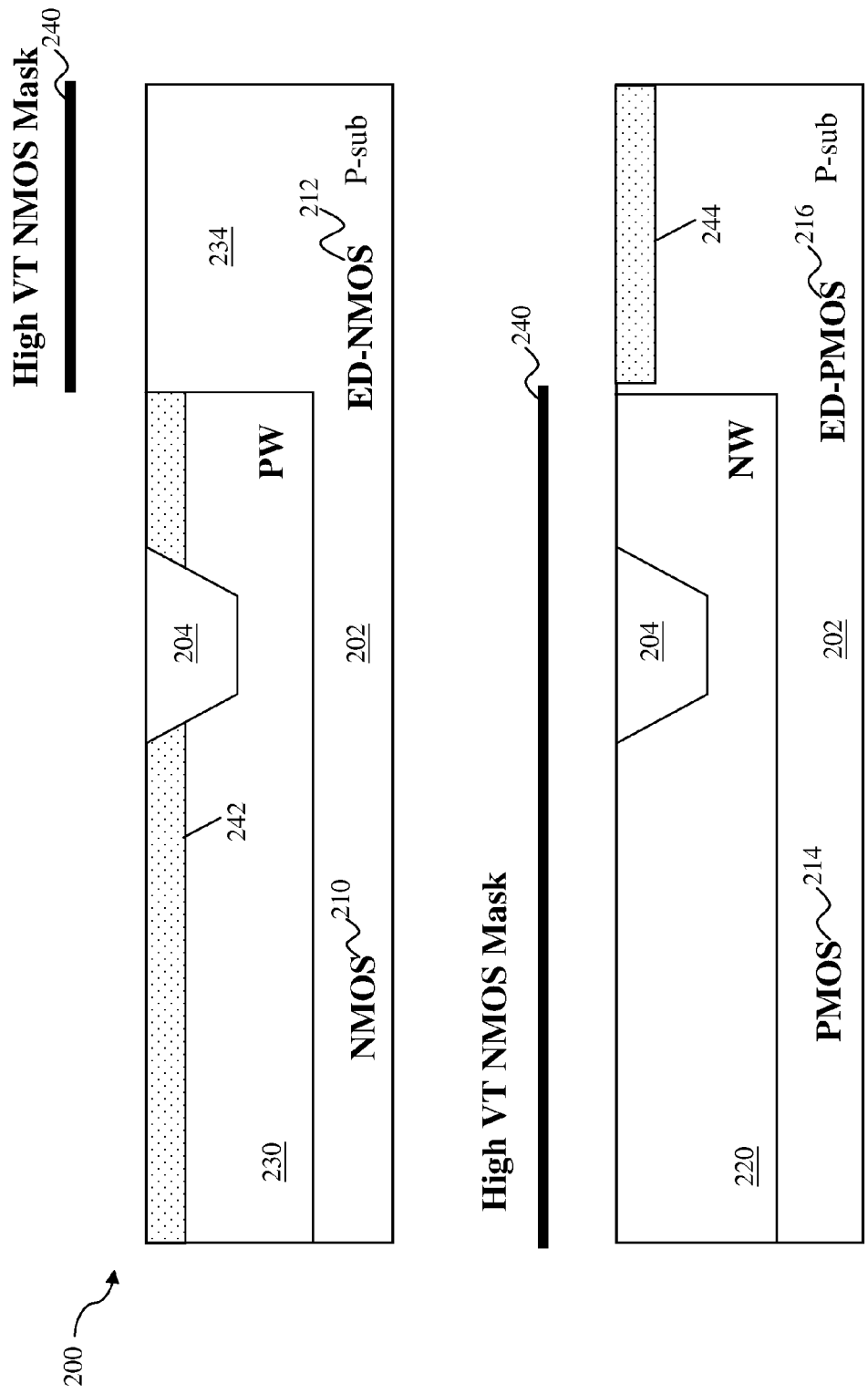

In FIG. 2D, an ion implantation process is performed to adjust a threshold voltage of the core NMOS transistor in the region 210. A high threshold voltage NMOS mask 240 is used to pattern a photoresist layer that protects the N-well 220 and the portion 234 of the region 212 of the ED-NMOS transistor. It is noted that other regions (not shown) of the substrate 202 may also be protected in which transistors may be formed without the threshold voltage adjustment as will be discussed later herein. Accordingly, the semiconductor device 200 may include core transistors with different threshold values for various applications. The threshold voltage can be adjusted to a higher value (more positive for NMOS transistor) by doping a channel region of the core NMOS transistor. Accordingly, a doped region 242 is formed in a top portion of the P-well 230. Further, the ion implantation process also forms an extended drain feature 244 of the ED-PMOS transistor in the region 216. As such, the doped region 242 in the channel region of the core NMOS transistor has substantially the same doping concentration as the extended drain feature 244 of the ED-PMOS transistor. The ion implantation process utilizes a P-type dopant, such as boron, with an implantation energy ranging from about 5 to 20 keV and a dose ranging from about 2E12 to 15E12 atoms/$cm^2$. It is noted that the extended drain feature 244 of the ED-PMOS transistor is formed by the same doping process (same photomask) that is performed to adjust the threshold voltage of the core NMOS transistor.

Figure 2E:
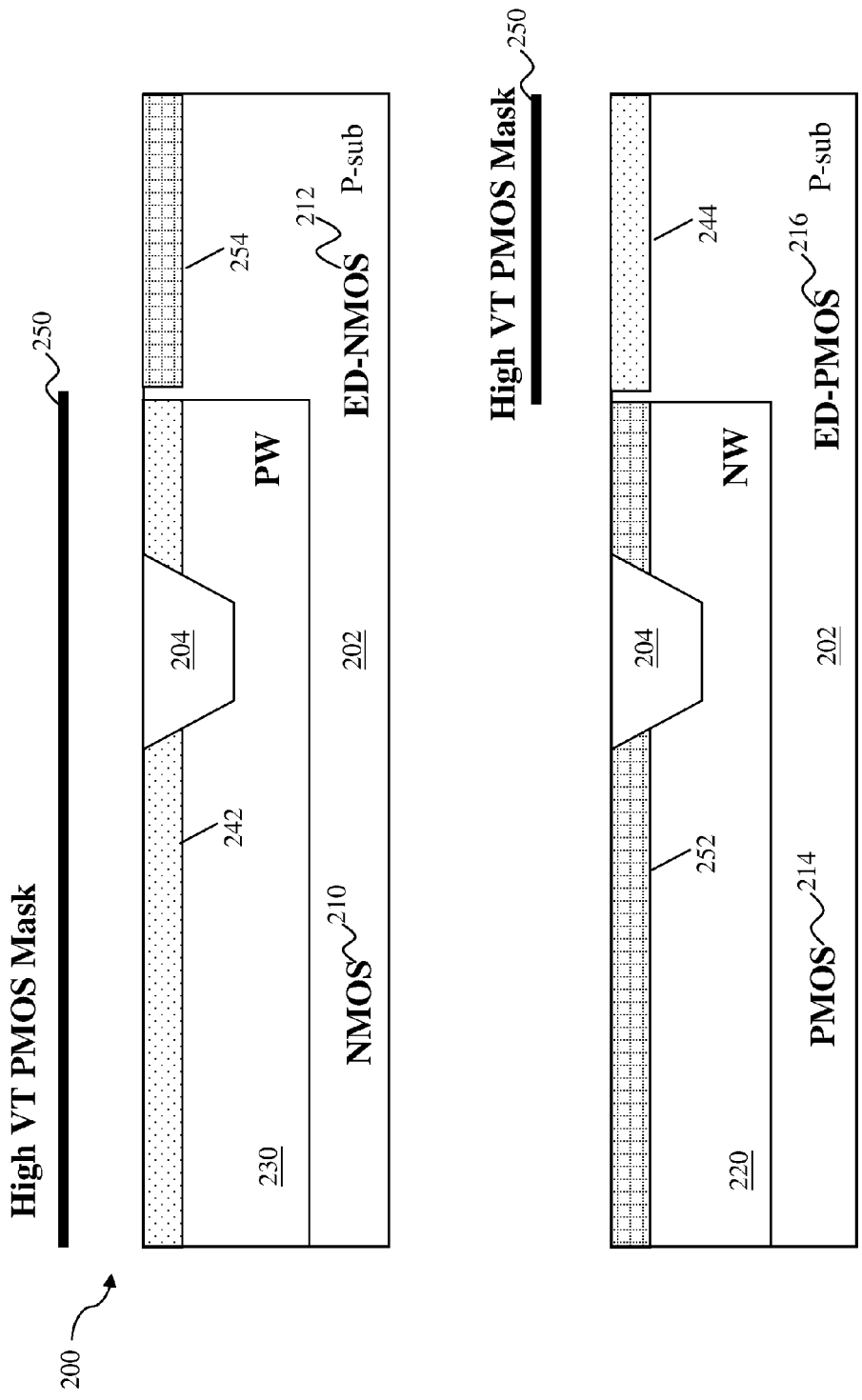

In FIG. 2E, an ion implantation process is performed to adjust a threshold voltage of the core PMOS transistor in the region 214. A high threshold voltage PMOS mask 250 is used to pattern a photoresist layer that protects the P-well 230 and the extended drain feature 244 of the ED-PMOS transistor in the region 216. It is noted that other regions (not shown) of the substrate 102 may also be protected in which transistors may be formed without the threshold voltage adjustment as will be discussed later herein. Accordingly, the semiconductor device 200 may include core transistors with different threshold values for various applications. The threshold voltage can be adjusted to a higher value (more negative for PMOS transistor) by doping a channel region of the core PMOS transistor. Accordingly, a doped region 252 is formed in the N-well 220. Further, the ion implantation process also forms an extended drain feature 254 of the ED-NMOS transistor in the region 212. As such, the doped region 252 in the channel region of the core PMOS transistor has substantially the same doping concentration as the extended drain feature 254 of the ED-NMOS transistor. The ion implantation process utilizes an N-type dopant, such as arsenic, with an implantation energy ranging from about 30 to 100 keV and a dose ranging from about 2E12 to 15E12 atoms/cm$^2$. It is noted that the extended drain feature 254 of the ED-NMOS transistor is formed by the same doping process (same photomask) that is performed to adjust the threshold voltage of the core PMOS transistor.

Figure 2F:
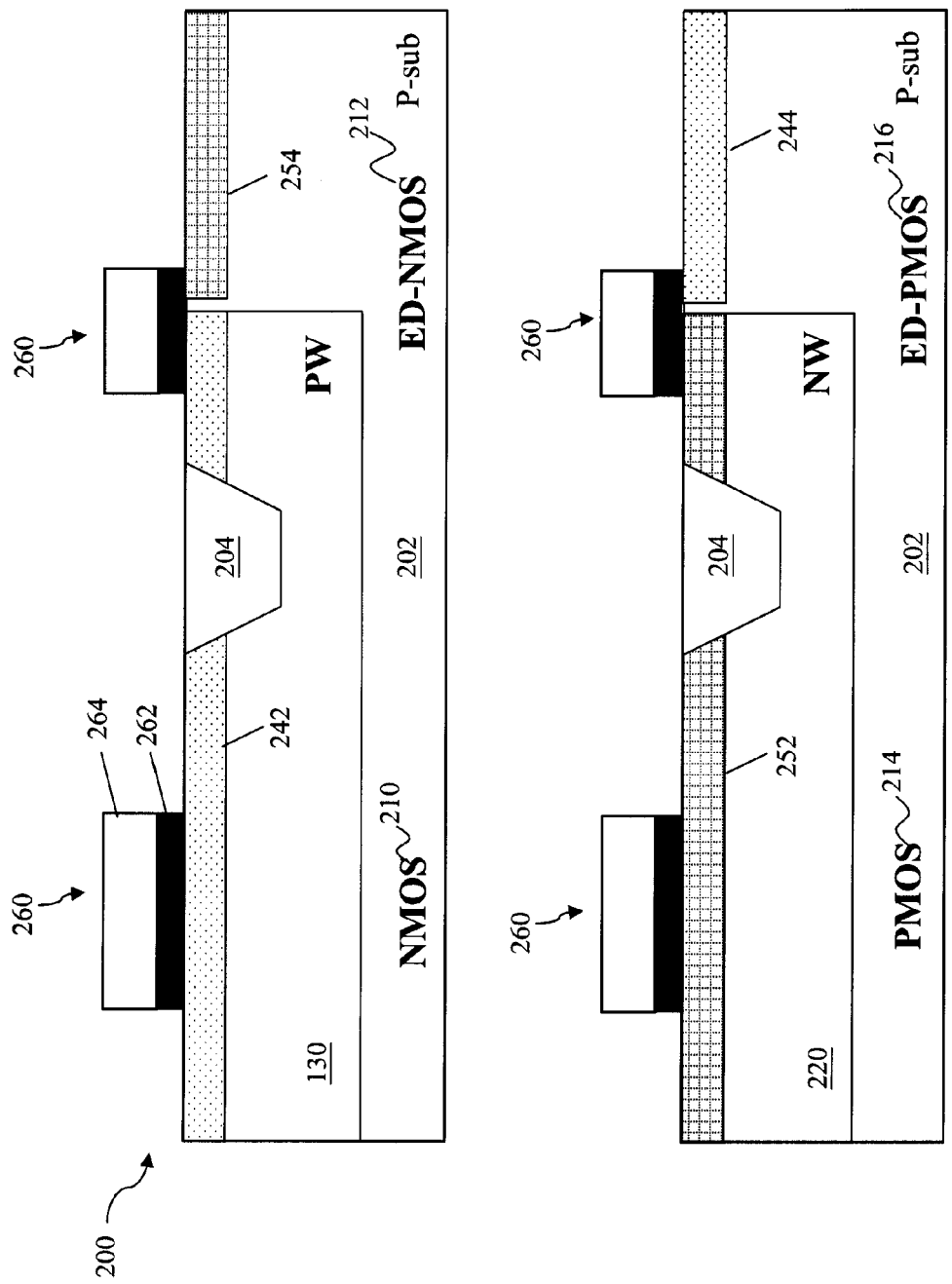

In FIG. 2F, gate structures 260 are formed for the transistors. The gate structures 260 may be disposed on the substrate 202, including a gate dielectric 262 formed on the substrate, and a gate electrode 264 formed on the gate dielectric. The extended drain features 244, 254 of the ED-PMOS and ED-NMOS transistors directly underlie a portion of the respective gate structures 260.

The gate dielectric may include a silicon oxide layer. Alternatively, the gate dielectric may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, HfO$_2$, or combinations thereof. The gate dielectric may have a multilayer structure such as one layer of silicon oxide and another layer of high k material. The gate dielectric layer may have a thickness ranging from about 20 Angstroms to about 200 Angstroms. The gate dielectric may be formed using chemical vapor deposition (CVD), physical vapor deposition (PVD), atomic layer deposition (ALD), thermal oxide, other suitable processes, or combinations thereof.

The gate electrode 264 may be configured to be coupled to metal interconnects and may be disposed overlying the gate dielectric 262. The gate electrode may include a doped polycrystalline silicon (or polysilicon). Alternatively, the gate electrode layer may include a metal such as Al, Cu, W, Ti, Ta, TiN, TaN, NiSi, CoSi, other suitable conductive materials, or combinations thereof. The gate electrode layer may be formed by CVD, PVD, plating, and other proper processes. The gate electrode layer may have a multilayer structure and may be formed in a multiple-step process using a combination of different processes.

The gate dielectric layer and the gate electrode layer formed on the substrate are then patterned to form a plurality of gate structures 260 using a process including photolithography patterning and etching. One exemplary method for patterning the gate dielectric and electrode layers is described below. A layer of photoresist is formed on the polysilicon layer by a suitable process, such as spin-on coating, and then patterned to form a patterned photoresist feature by a proper lithography patterning method. The pattern of the photoresist can then be transferred by a dry etching process to the underlying polysilicon layer and the gate dielectric layer to form gate electrodes and gate dielectric, in a plurality of processing steps and various proper sequences. The photoresist layer may be stripped thereafter. In another embodiment, only the gate electrode layer is patterned. In another embodiment, a hard mask layer may be used and formed on the polysilicon layer. The patterned photoresist layer is formed on the hard mask layer. The pattern of the photoresist layer is transferred to the hard mask layer and then transferred to the polysilicon layer to form the gate electrode. The hard mask layer may include silicon nitride, silicon oxynitride, silicon carbide, and/or other suitable dielectric materials, and may be formed using a method such as CVD or PVD.

Although not shown, it is understood that the semiconductor device 200 may undergo further CMOS technology processing as is known in the art to complete fabrication of the transistors. Accordingly, the CMOS technology process flow is only described briefly herein. For example, lightly doped source/drain (LDD) regions of a P-type may be formed in the N-well 220 by an ion implantation process. The implantation process may include a P-type dopant such as boron or BF$_2$. LDD regions of an N-type may be formed in the P-well 230 by an ion implantation process. The implantation process may include an N-type dopant such as arsenic or phosphorous. The LDD regions may have an edge substantially self-aligned to an edge of the gate structure. Additionally, an angled implantation process may be implemented to form halo regions for eliminating short channel effect. The halo regions may comprise the same type of dopant as the dopant of the well but with a higher doping concentration.

Sidewall spacers may be formed on both sidewalls of the gate structure. The sidewall spacers may include a dielectric material such as silicon oxide. Alternatively, the sidewall spacers may optionally include silicon nitride, silicon carbide, silicon oxynitride, or combinations thereof. In some embodiments, the sidewall spacers may have a multilayer structure. The sidewall spacers may be formed by a deposition and etching (with an anisotropic etching technique) as is known in the art.

Figure 3A:
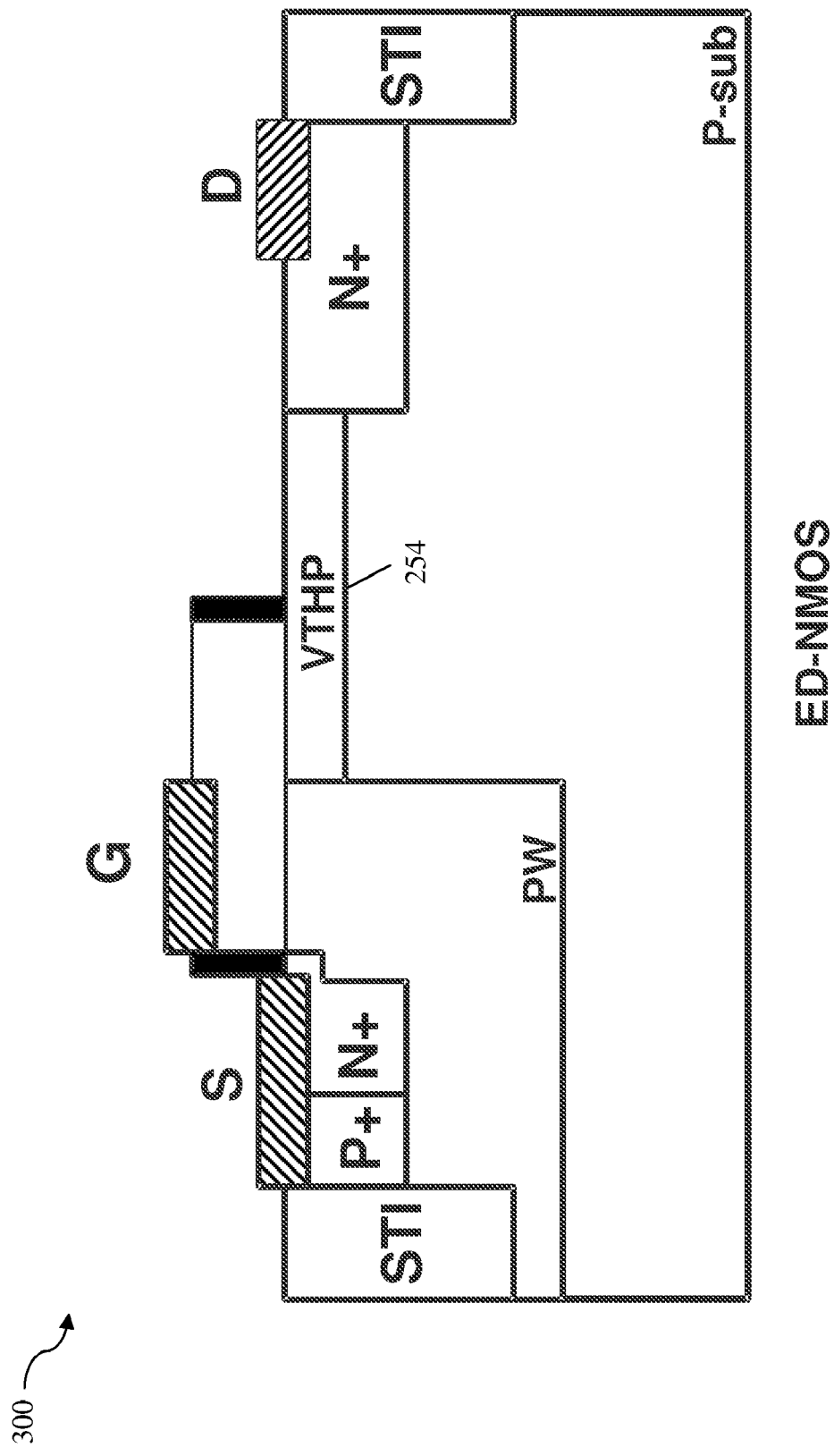
FIGS. 3A and 3B are cross-sectional view of an extended drain NMOS transistor and extended drain PMOS transistor, respectively, that are formed according to the method of FIG. 1.
Figure 3B:
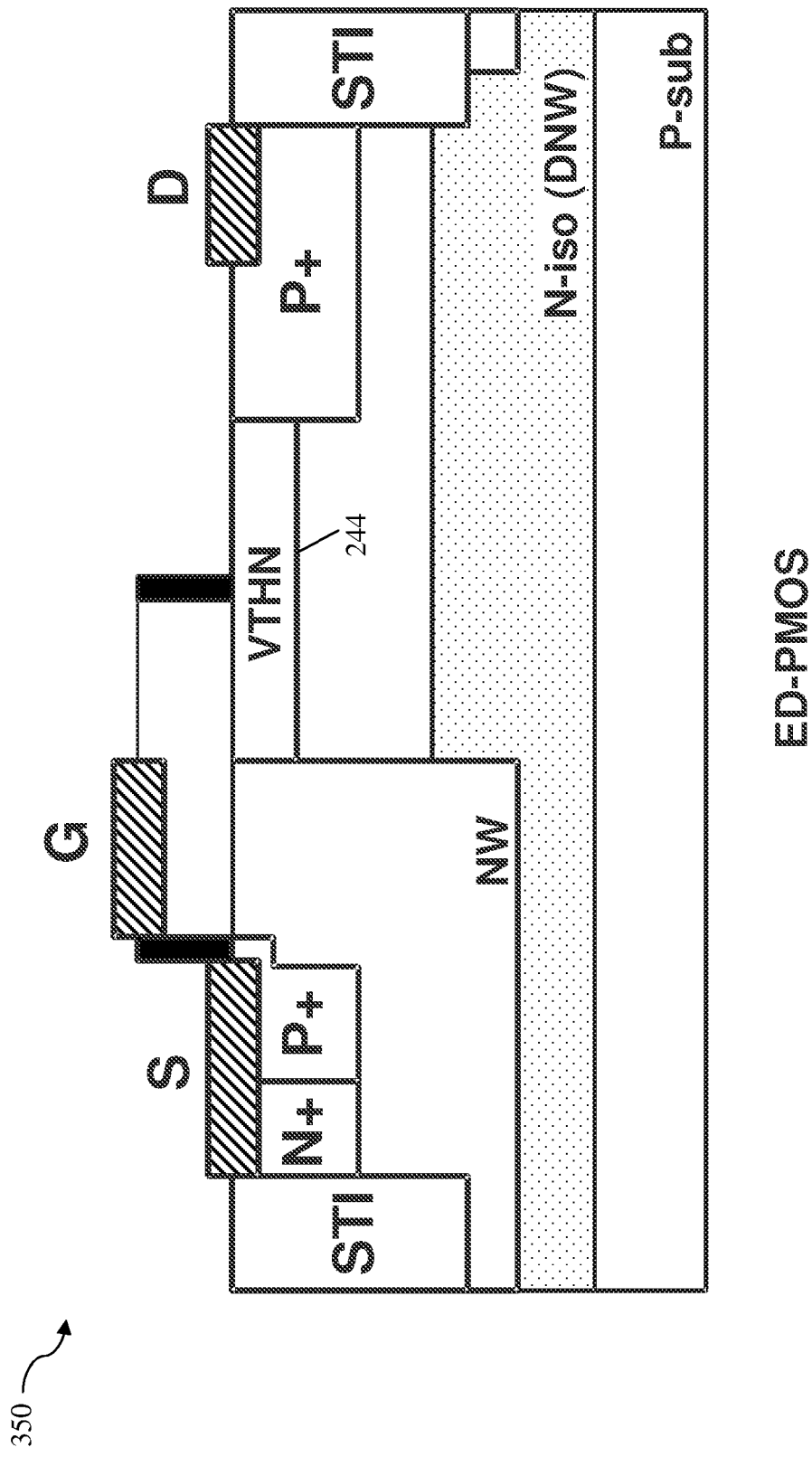

A process to form source/drain of an N-type (referred to as N+ or heavily doped region) may be performed for the core NMOS transistor and ED-NMOS transistor, and source/drain of a P-type (referred to as P+ or heavily doped region) for the core PMOS transistor and ED-PMOS transistor. The source and drain may be positioned on both sides of the gate structure 260 and interposed thereby. In the present embodiment, the source and drain regions include N-type dopant such as phosphorus or arsenic, and P-type dopant such as boron. The source and drain may be formed by a method such as ion implantation or diffusion. A rapid thermal annealing (RTA) process may be used to activate the implanted dopant. In various embodiments, the source and drain regions may have different doping profiles formed by multi-process implantation A resist protective oxide may be formed to function as a silicide blocking layer during a subsequent salicide process. The semiconductor device 200 may further include forming various contacts and metal features on the substrate. In some embodiments, silicide features may be formed by silicidation such as self-aligned silicide (salicide) in which a metal material is formed next to the silicon structures, then the temperature is raised to anneal and cause reaction between underlying silicon and the metal to form silicide, and un-reacted metal is etched away. The salicide material may be self-aligned to be formed on various features such as the source region, drain region and/or gate electrode to reduce contact resistance. In other embodiments, the silicide features are not self aligned (as shown in FIGS. 3A and 3B), and thus masking is used for the gate and drain.

Also, a plurality of patterned dielectric layers and conductive layers are formed on the substrate to form multilayer interconnects configured to couple the various p-type and n-type doped regions, such as the source, drain region, contact region, and gate electrode. In one embodiment, an interlayer dielectric (ILD) and a multilayer interconnect (MLI) structure are formed in a configuration such that the ILD separates and isolates each metal layer from other metal layers of the MLI structure. In furtherance of the example, the MLI structure includes contacts, vias and metal lines formed on the substrate. In one example, the MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical connection (via and contact) and horizontal connection (conductive line). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

The ILD material includes silicon oxide. Alternatively or additionally, the ILD includes a material having a low dielectric constant such as a dielectric constant less than about 3.5. In one embodiment, the dielectric layer includes silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The dielectric layer may be formed by a technique including spin-on, CVD, or other suitable processes.

MLI and ILD structure may be formed in an integrated process such as a damascene process. In a damascene process, a metal such as copper is used as conductive material for interconnection. Another metal or metal alloy may be additionally or alternatively used for various conductive features. Accordingly, silicon oxide, fluorinated silica glass, or low dielectric constant (k) materials can be used for ILD. During the damascene process, a trench is formed in a dielectric layer, and copper is filled in the trench. A chemical mechanical polishing (CMP) technique is implemented afterward to etch back and planarize the substrate surface.

Referring to FIGS. 3A and 3B, illustrated are cross-sectional views of an ED-NMOS transistor 300 and ED-PMOS transistor 350, respectively, that may be implemented in the semiconductor device 200 of FIG. 2. FIGS. 3A and 3B illustrate transistors that have been fabricated in CMOS technology processing as discussed above. The ED-MOS transistor 300 and ED-PMOS transistor 350 may be similar to the ones discussed above with reference to FIG. 2. Accordingly, similar features in FIGS. 2 and 3 are numbered the same for the sake of clarity and simplicity. In FIG. 3A, the ED-NMOS transistor 300 includes an extended drain feature 254 that was formed without additional steps/masks in the CMOS technology process flow. More specifically, the extended drain feature 254 was formed by using a well blocking feature (e.g., P-well Mask) and threshold voltage adjustment process (e.g., high VT PMOS mask) in the CMOS technology process flow. The threshold voltage adjustment process includes a doping process that was performed for the core PMOS transistor, and the doped region that is formed may be referred to as VTHP.

In FIG. 3B, the ED-PMOS transistor 350 includes an extended drain feature 244 that was formed without additional steps/masks in the CMOS technology process flow. More specifically, the extended drain feature 244 was formed by using a well blocking feature (e.g., N-well Mask) and threshold voltage adjustment process (e.g., high VT NMOS mask) in the CMOS technology process flow. The threshold voltage adjustment process includes a doping process that was performed for the core NMOS transistor, and the doped region that is formed may be referred to as VTHN. It has been observed that the operating (drain) voltages of the extended drain transistors can be 5 V or higher (e.g., 20-35 V). Further, these transistors have a lower on resistance (e.g., Ron) as compared to a configuration of cascoded transistors.

Referring to FIGS. 4A and 4B, illustrated are cross-sectional views of a core NMOS transistor 400 and core PMOS transistor 450, respectively, that may be implemented in the semiconductor device 200 of FIG. 2. FIGS. 4A and 4B illustrate core transistors that have been fabricated in CMOS technology processing as discussed above. The core NMOS transistor 400 and core PMOS transistor 450 may be similar to the ones discussed above with reference to FIG. 2. Accordingly, similar features in FIGS. 3 and 4 are numbered the same for the sake of clarity and simplicity. In FIG. 4A, the core NMOS transistor 400 includes a channel region 242 that is doped to adjust a threshold voltage (e.g., high VT NMOS mask). As noted in FIG. 3B, the doped region that is formed may be referred to as VTHN. Accordingly, the doped channel region 242 of the core NMOS transistor 400 and the extended drain feature 244 of the ED-PMOS transistor 350 (FIG. 3B) may have substantially the same doping concentration. In FIG. 4B, the core PMOS transistor 450 includes a channel region 252 that is doped to adjust a threshold voltage (e.g., high VT PMOS mask). As noted in FIG. 3A, the doped region that is formed may be referred to as VTHP. Accordingly, the doped channel region 252 of the core PMOS transistor 450 and the extended drain feature 254 of the ED-NMOS transistor 300 (FIG. 3A) may have substantially the same doping concentration.

Referring to FIGS. 5A and 5B, illustrated are cross-sectional views of a core NMOS transistor 500 and core PMOS transistor 550, respectively, that may be implemented in the semiconductor device 200 of FIG. 2. FIGS. 5A and 5B illustrate core transistors that have been fabricated in CMOS technology processing as discussed above. The core NMOS transistor 500 and core PMOS transistor 550 are similar to the core NMOS transistor 400 and core PMOS transistor 450 of FIGS. 4A and 4B, respectively, except that the threshold voltage adjustment is not performed on the core NMOS transistor 500 and core PMOS transistor 550. Accordingly, the core NMOS transistor 500 includes a channel region 502 that is protected during a doping process that is performed to adjust the threshold voltage (e.g., high VT NMOS mask), and the core PMOS transistor 550 includes a channel region 552 that is protected during a doping process that is performed to adjust the threshold voltage (e.g., high VT PMOS mask). It is desirable to fabricate semiconductor devices having transistors with different threshold voltages for various applications. It is noted that the core NMOS transistor 500 and core PMOS transistor 550 have similar operating (drain) voltages as the core NMOS transistor 400 and core PMOS transistor of FIGS. 4A and 4B, respectively.

Figures 6A, 6B:
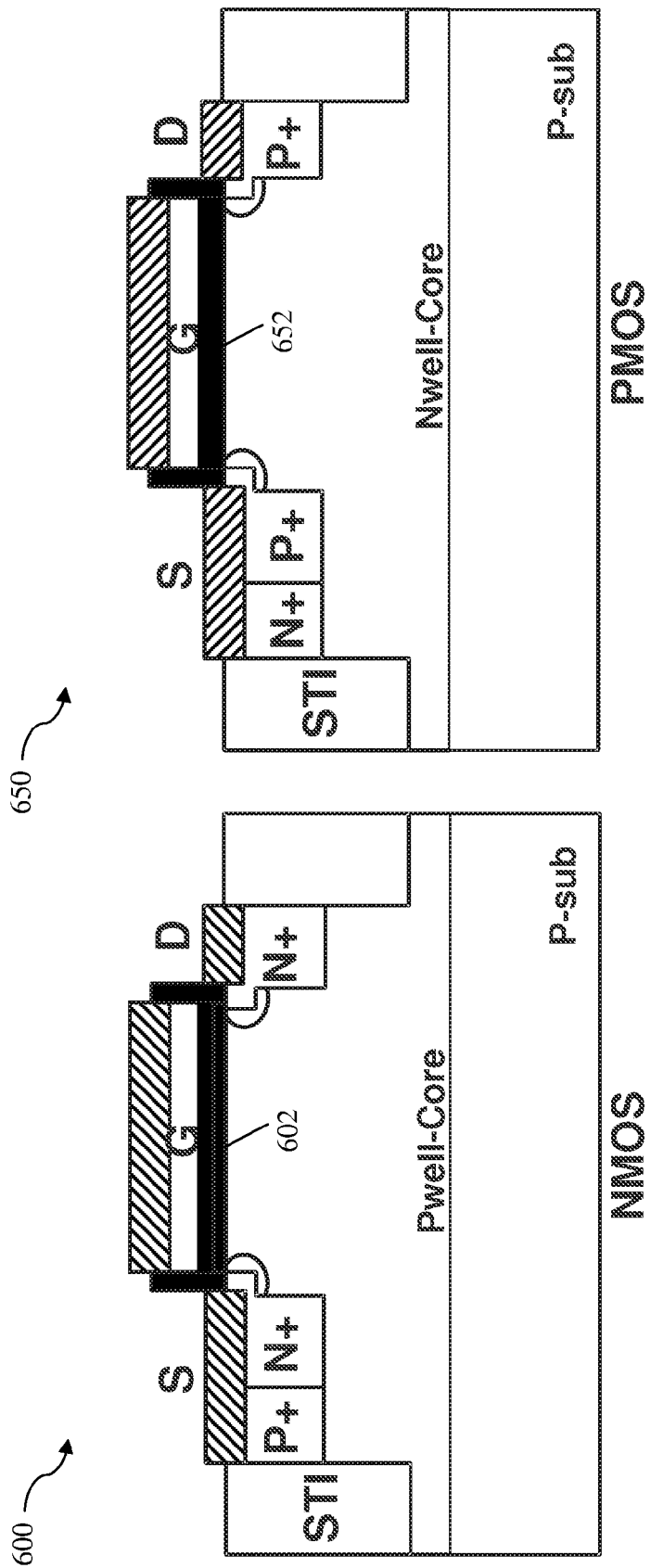
FIGS. 6A and 6B are cross-sectional views of an input/output NMOS transistor and input/output PMOS transistor.

Referring to FIGS. 6A and 6B, illustrated are cross-sectional view of input/output (I/O) NMOS transistor 600 and I/O PMOS transistor, respectively, that may be implemented in the semiconductor device 200 of FIG. 2. FIGS. 6A and 6B illustrate I/O transistors that have been fabricated in CMOS technology processing as discussed above. It is noted that different Well, LDD implant, N+ and P+ masks, and gate oxide thickness may be used for core transistors and I/O transistors but some of these the masks may be shared as well. The I/O NMOS transistor 600 and I/O PMOS transistor 650 are similar to the core NMOS transistor 500 and core PMOS transistor 550 of FIGS. 5A and 5B, respectively, except that the I/O transistor have a thicker gate dielectric 602, 652 (e.g., gate oxide) for a higher operating (drain) voltage.

In summary, the various embodiments disclosed herein provide a cost-effective and simple method of fabricating transistors with different flavors on a same chip for complex SoC technology. For example, low and medium/high voltage CMOS transistors can be provided for applications (i.e., mobile device) having a combination of digital blocks (i.e., logic and memory) with power management (i.e., battery supply voltage conversion to digital voltage), amplification (i.e., wireless connectivity function), drivers (i.e., audio), and other circuits that require voltages significantly higher than the available 2.5 V supply voltage. Fabrication of medium/high voltage transistors can be easily integrated with the fabrication of low voltage transistors in CMOS technology process flow without additional steps/masks, and thus reducing the cost and complexity of fabrication. The extended drain feature of the medium/high voltage transistor can be formed using the same masks corresponding to the threshold voltage adjustment process in combination with the well blocking feature. Accordingly, the methods and devices disclosed herein are applicable to CMOS technologies from 0.25 um to 65 nm and below.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
providing a semiconductor substrate having a first portion and a second portion;
forming a first transistor of a first type in the first portion of the substrate, the first transistor being operable at a first voltage;
forming a second transistor of a second type in the second portion of the substrate, the second type being opposite the first type, the second transistor being operable at a second voltage greater than the first voltage;
wherein the forming the second transistor includes:
forming an extended doped feature of the second transistor while simultaneously forming a doped channel region of the first transistor that is used to adjust a threshold voltage of the first transistor, wherein the extended dope feature and the channel region are of the second type; and
forming a well of the first type in the semiconductor substrate under a gate of the second transistor, wherein the well does not extend directly under the extended doped feature and the extended doped feature does not extend directly under the well; and
forming a third transistor of the second type in a third portion of the substrate, the third transistor being operable at the first voltage.

2. The method of claim 1, wherein the first transistor includes a PMOS transistor and the second transistor includes an extended drain NMOS transistor.

3. The method of claim 1, wherein the first transistor includes an NMOS transistor and the second transistor includes an extended drain PMOS transistor.

4. The method of claim 1, wherein the forming the third transistor includes forming a well of the first type in the substrate;
wherein the forming the second transistor includes protecting a region of the second portion of the substrate when forming the well of the third transistor, the region being where the extended feature is to be formed.

5. The method of claim 4, wherein the well of the third transistor is formed in another region of the second portion of the substrate;
wherein the extended doped feature is an extended drain feature of a second conductivity type different from the first conductivity type, the extended drain feature directly underlying a portion of a gate structure of the second transistor.

6. The method of claim 4, wherein the forming the third transistor includes protecting the third portion of the substrate when forming the doped channel region of the first transistor such that the threshold voltage of the first transistor is greater than a threshold voltage of the third transistor.

7. The method of claim 1, wherein the third transistor includes a gate dielectric that has a greater thickness than a gate dielectric of one of the first transistor and the second transistor.

8. The method of claim 1, wherein the second operating voltage exceeds approximately 5 Volts.

9. The method of claim 1, wherein forming the extended doped feature of the second transistor is performed with a photomask.

10. The method of claim 9, wherein forming the extended doped feature of the second transistor is performed with an implant process.

11. The method of claim 1, wherein a bottom surface of the extended doped feature physically contacts the semiconductor substrate and a bottom surface of the well of the second transistor physically contacts the semiconductor substrate.

12. The method of claim 1, wherein the forming the second transistor further includes performing an implantation process on the well of the second transistor using a dopant of the first type to form a doped region in an upper portion of the well.

13. A method comprising:
providing a semiconductor substrate of a first dopant type having a first region and a second region;
forming a first well of the first dopant type in the second region and a second well of a second dopant type in the first region, wherein the first well has a bottommost surface physically contacting the semiconductor substrate;

performing a first implantation process on the first well using the first dopant type to form a first doped region in an upper portion of the first well;

forming a first extended doped feature adjacent the first well in the second region while simultaneously forming a first doped channel region in the first region that is used to adjust a threshold voltage of a first gate structure, wherein the first extended doped feature and the first doped channel region are of the second dopant type, wherein the first extended doped feature has a bottommost surface physically contacting the semiconductor substrate;

forming the first gate structure in the first region over the second well; and forming a second gate structure in the second region over the first extended doped feature and the first well.

14. The method of claim 13, further comprising:

forming a third well of the first dopant type in the second region and a fourth well of a second dopant type in the first region, wherein the fourth well has a bottommost surface physically contacting the semiconductor substrate;

performing a second implantation process on the fourth well using the second dopant type to form a second doped region in an upper portion of the second well;

forming a second extended doped feature adjacent the fourth well in the first region while simultaneously forming a second doped channel region in the second region that is used to adjust a threshold voltage of a fourth gate structure, wherein the second extended doped feature and the second doped channel region are of the first dopant type, wherein the second extended doped feature has a bottommost surface physically contacting the semiconductor substrate;

forming a third gate structure in the second region over the third well; and forming the fourth gate structure in the first region over the second extended doped feature and the fourth well.

* * * * *